(12) United States Patent
Feldman et al.

(10) Patent No.: US 10,247,797 B2
(45) Date of Patent: Apr. 2, 2019

(54) METHODS FOR PRODUCING A SEMI-ADIABATIC SPECTRAL-SPATIAL SPECTROSCOPIC IMAGING SEQUENCE AND DEVICES THEREOF

(71) Applicant: Icahn School of Medicine at Mount Sinai, New York, NY (US)

(72) Inventors: Rebecca Emily Feldman, New York, NY (US); Priti Balchandani, New York, NY (US)

(73) Assignee: ICAHN SCHOOL OF MEDICINE AT MOUNT SINAI, New York, NY (US)

( * ) Notice: Subject to any disclaimer, the term of this patent is extended or adjusted under 35 U.S.C. 154(b) by 453 days.

(21) Appl. No.: 14/960,071

(22) Filed: Dec. 4, 2015

(65) Prior Publication Data
US 2017/0160361 A1  Jun. 8, 2017

(51) Int. Cl.
*G01V 3/00* (2006.01)
*G01R 33/483* (2006.01)
(Continued)

(52) U.S. Cl.
CPC ....... *G01R 33/4833* (2013.01); *G01R 33/485* (2013.01); *G01R 33/4616* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341;
(Continued)

(56) References Cited

U.S. PATENT DOCUMENTS 5,189,371 A * 2/1993 Conolly ............... G01R 33/446
                                                    324/307
5,283,526 A * 2/1994 Spielman ........... G01R 33/4828
                                                    324/307
(Continued)

OTHER PUBLICATIONS

Zhu, et al., "MR Spectroscopy and Spectroscopic Imaging of the Brain," Methods Mol. Biol. 711:203-226 (2011).
(Continued)

*Primary Examiner* — Thang X Le
(74) *Attorney, Agent, or Firm* — LeClairRyan PLLC

(57) ABSTRACT

A method, magnetic resonance imaging computing device, and a non-transitory computer readable medium for producing a semi-adiabatic spectral-spatial spectroscopic imaging sequence for magnetic resonance imaging. A pulse control signal comprising a pair of adiabatic pulses and a linear phase pulse is generated. The pulse control signal is transformed into a pair of spectral-spatial refocusing pulses and an excitation pulse. The pair of spectral-spatial refocusing pulses and the excitation pulse are output to a waveform generator to produce the semi-adiabatic spectral-spatial spectroscopic imaging sequence.

39 Claims, 15 Drawing Sheets

(51) Int. Cl.
*G01R 33/485* (2006.01)
*G01R 33/46* (2006.01)
(58) Field of Classification Search
CPC ............ G01R 33/385; G01R 6185/055; G01R 33/0555; G01R 33/7278; G01R 33/725
See application file for complete search history.

(56) References Cited

U.S. PATENT DOCUMENTS

| | | | | |
|---|---|---|---|---|
| 9,234,953 | B2* | 1/2016 | Labadie | G01R 33/4818 |
| 2009/0137897 | A1* | 5/2009 | Balchandani | A61B 5/05 600/410 |
| 2012/0013336 | A1* | 1/2012 | Hetzer | G01R 33/4818 324/309 |
| 2012/0283547 | A1* | 11/2012 | Wong | A61B 5/055 600/410 |
| 2014/0300353 | A1* | 10/2014 | He | A61B 5/4312 324/309 |

OTHER PUBLICATIONS

Kreis et al., "Development of the Human Brain: in Vivo Quantification of Metabolite and Water Content with Proton Magnetic Resonance Spectroscopy," Magn. Reson. Med. 30:424-437 (1993).
Michaelis et al., "Absolute Concentrations of Metabolites in the Adult Human Brain in Vivo: Quantification of Localized Proton MR Spectra," Radiology 187:219-227 (1993).
Pouwels et al., "Regional Metabolite Concentrations in Human Brain as Determined by Quantitative Localized Proton MRS," Magn. Reson. Med. 39:53-60 (1998).
Wijtenburg et al., "In Vivo Assessment of Neurotransmitters and Modulators with Magnetic Resonance Spectroscopy: Application to Schizophrenia," Neurosci. Biobehav. Rev. 51:276-295 (2015).
Wilson et al., "Noninvasive Detection of Glutamate Predicts Survival in Pediatric Medulloblastoma," Clin. Cancer Res. 20:4532-4539 (2014).
Delorme et al., "Applications of MRS in the Evaluation of Focal Malignant Brain Lesions," Cancer Imaging 6:95-99 (2006).
Wijnen et al., "Quantitative Short Echo Time 1H MRSI of the Peripheral Edematous Region of Human Brain Tumors in the Differentiation Between Glioblastoma, Metastasis, and Meningioma," J. Magn. Reson. Imaging 36:1072-1082 (2012).
Boer et al., "7-T (1) H MRS with Adiabatic Refocusing at Short TE Using Radio-Frequency Focusing With a Dual-Channel Volume Transmit Coil," NMR Biomed. 24:1038-1046 (2011).
Balchandani et al., "Interleaved Narrow-Band PRESS Sequence With Adiabatic Spatial-Spectral Refocusing Pulses for 1H MRSI at 7T," Magn. Reson. Med. 59:973-979 (2008).
Pauly et al., "Parameter Relations for the Shinnar-Le Roux Selective Excitation Pulse Design Algorithm [NMR imaging]," IEEE Trans. Med. Imaging 10:53-65 (1991).
Schricker et al., "Dualband Spectral-Spatial RF Pulses for Prostate MR Spectroscopic Imaging," Magn. Reson. Med. 16:1079-1087 (2001).
Conolly et al., "Two-Dimensional Selective Adiabatic Pulses," Magn. Reson. Med. 24:302-313 (1992).
Xu et al., "Phased Array 3D MR Spectroscopic Imaging of the Brain at 7 T," Magn. Reson. Imaging 26: 1201-1206 (2008).
Balchandani et al., "Designing Adiabatic Radio Frequency Pulses Using the Shinnar-Le Roux Algorithm," Magn. Reson. Med. 64:843-851 (2010).
Hargreaves et al., "Variable-Rate Selective Excitation for Rapid MRI Sequences," Magn. Reson. Med. 52:590-597 (2004).
Conolly et al., "Variable-Rate Selective Excitation," J. Magn. Reson. 78:440-458 (1988).
Mekle et al., "MR Spectroscopy of the Human Brain With Enhanced Signal Intensity at Ultrashort Echo Times on a Clinical Platform at 3T and 7T," Magn. Reson. Med. 61:1279-1285 (2009).
Tkac et al, "In Vivo 1H NMR Spectroscopy of the Human Brain at 7 T," Magn. Reson. Med. 46:451-456 (2001).
Bottomley, "Spatial Localization in NMR Spectroscopy in Vivo," Ann N.Y. Acad. Sci. 508:333-348 (1987).
Moonen et al., "Comparison of Single-Shot Localization Methods (STEAM and PRESS) for in Vivo Proton NMR Spectroscopy," NMR Biomed 2:201-208 (1989).
Luyten et al., "Acquisition and Quantitation in Proton Spectroscopy," NMR Biomed. 4:64-69 (1991).
Adalsteinsson et al., "Spatially Resolved Two-Dimensional Spectroscopy," Magn. Reson. Med. 41:8-12 (1999).
Sacolick et al., "Adiabatic Refocusing Pulses for Volume Selection in Magnetic Resonance Spectroscopic Imaging," Magn. Reson. Med. 57:548-553 (2007).
Garwood et al., "The Return of the Frequency Sweep: Designing Adiabatic Pulses for Contemporary NMR," J. Magn. Reson. 153:155-177 (2001).
Hess et al., "Real-Time Motion and B0 Correction for Localized Adiabatic Selective Refocusing (LASER) MRSI Using Echo Planar Imaging Volumetric Navigators," NMR Biomed. 25:347-358 (2012).
Cunningham et al., "Design of Symmetric-Sweep Spectral-Spatial RF Pulses for Spectral Editing," Magn. Reson. Med. 52:147-153 (2004).
Star-Lack et al., "Improved Water and Lipid Suppression for 3D PRESS CSI Using RF Band Selective Inversion With Gradient Dephasing (BASING)," Magn. Reson. Med. 38:311-321 (1997).
Tkac et al., "In Vivo 1H NMR Spectroscopy of the Human Brain at High Magnetic Fields: Metabolite Quantification at 4t vs. 7T," Magn. Reson. Med. 62:868-879 (2009).
Scheenen et al., "Short Echo Time 1 H-MRSI of the Human Brain at 3T with Minimal Chemical Shift Displacement Errors Using Adiabatic Refocusing Pulses," Magn. Reson. Med. 59:1-6 (2008).
Scheenen et al., "Towards 1H-MRSI of the Human Brain at 7T with Slice-Selective Adiabatic Refocusing Pulses," MAGMA 21:95-101 (2008).
Cunningham et al., "Sequence Design for Magnetic Resonance Spectroscopic Imaging of Prostate Cancer at 3 T," Magn. Reson. Med. 53:1033-1039 (2005).
Bernstein et al., "Signal Acquisition and K-Space Sampling," in Bernstein, eds., Handbook of MRI Pulse Sequences, Burlington, MA:Elsevier Academic Press, Chapter 11, pp. 367-442 (2004).
Haase et al., "1H NMR Chemical Shift Selective (CHESS) Imaging," Phys. Med. Biol. 30:341-344 (1985).
Provencher S.W., "Estimation of Metabolite Concentrations From Localized In Vivo Proton NMR Spectra," Magn. Reson. Med. 30:672-679 (1993).
Luo et al., "BISTRO: An Outer-Volume Suppression Method That Tolerates RF Field Inhomogeneity," Magn. Reson. Med. 45:1095-1102 (2001).
Tkac et al., "In Vivo 1H NMR Spectroscopy of Rat Brain at 1 MS Echo Time," Magn. Reson. Med. 41:649-656 (1999).
Feldman et al., "A Semiadiabatic Spectral-Spatial Spectroscopic Imaging (SASSI) Sequence for Improved High-Field MR Spectroscopic Imaging", Magn. Reson. Med. (2015).

\* cited by examiner

METHODS FOR PRODUCING A SEMI-ADIABATIC SPECTRAL-SPATIAL SPECTROSCOPIC IMAGING SEQUENCE AND DEVICES THEREOF

This invention was made with government support under grant number R00 NS070821 awarded by NIH. The government has certain rights in this invention.

FIELD

This technology generally relates to methods and devices for magnetic resonance imaging and, more particularly, to methods and devices for producing a semi-adiabatic spectral-spatial spectroscopic imaging sequence.

BACKGROUND

Magnetic resonance spectroscopic imaging (MRSI) is often used to investigate metabolite concentration changes. Specifically, MSRI can be used to non-invasively investigate metabolite concentration changes in the brain correlated to neurological and psychiatric diseases, brain tumors, and radiation damage. MRSI has been performed at field strengths such as 1.5 T and 3 T. However, with transition to higher field strengths come challenges, such as greater radiofrequency power deposition, which may approach specific absorption rate (SAR) safety limits, transmitted radiofrequency ($B_1$) inhomogeneity, and more severe spatial shifts in the excited volume for metabolites resonating at two different frequencies and/or chemical shift localization (CSL) errors. The 180 degree radiofrequency pulses in the conventional MRSI sequences are particularly susceptible to the variation in transmitted radiofrequency field and severe chemical shift at magnetic field strengths of 7 T. This results in signal attenuation in multiple regions of the excited volume.

Spectroscopic imaging is most commonly performed using a point resolved spectroscopy (PRESS) sequence which uses a 90 degree radiofrequency pulse followed by at least two 180 degree radiofrequency pulses. The radiofrequency pulses are selected along different spatial dimensions and form a double spin echo over the volume of interest. In MRSI, further spatial localization is performed within the volume of interest through the use of phase encodes or oscillating read out gradients. The 180 degree radiofrequency pulses used in the PRESS sequence are particularly sensitive to the substantial variation in $B_1$ that exists at higher field strengths, resulting in drastic signal attenuation in multiple regions of the brain. These pulses are also very susceptible to CSL error, which scales linearly with field strength, resulting in substantial shifts in the selected volume for metabolites that are sparsely separated in frequency. Although high bandwidth radiofrequency pulses may mitigate the CSL error, they come at the cost of increased SAR.

Excess power deposition during the scan is also a challenge at higher field strengths. Radiofrequency power deposition, as measured by SAR, increases quadratically with field strength and 180 degree RF pulses are particularly SAR intensive. At higher field strengths, radiofrequency pulse sequences containing two or more 180 degree pulses, such as the double spin echo PRESS sequence, may reach or exceed SAR safety limits leading to an imaging delay or termination of the acquisition.

In order to address some of these challenges, several variants of the conventional PRESS sequence have been proposed. Adiabatic pulses create $B_1$-insensitive refocusing and reduced CSL error. A 3D adiabatic MRSI sequence, such as Localized Adiabatic Selective Refocusing (LASER), achieves volume selection using adiabatic full passage refocusing pulses along all three spatial axes. However, adiabatic pulses are SAR-intensive and typically deposit quadratic phase across the spatially selective dimension which must be refocused, most often with a second, identical, adiabatic full passage (AFP) pulse across the same axis. A fully 3D MRSI sequence, such as LASER, requires at least 6 matched adiabatic refocusing pulses, resulting in an extended minimum echo time, and very high SAR.

The semi-LASER sequence uses a non-adiabatic selective excitation, combined with two pairs of adiabatic refocusing pulses. This enables a shorter echo time and results in lower SAR when compared to LASER. However, the 4 high-SAR adiabatic refocusing pulses still limit the application of semi-LASER MRSI in vivo, by extending total scan time.

Adiabatic spectral spatial pulses (SPSP) have been used in MRSI sequences to simultaneously provide $B_1$-insensitive selection and reduced CSL error. Since the spatial selectivity is achieved by linear-phase spatial sub-pulses, pairs of pulses are not required to refocus quadratic phase in the spatial dimensions. Quadratic phase is deposited in the spectral dimension by the first adiabatic 180 degree pulse, but this quadratic phase is refocused by a second identical SPSP adiabatic 180 degree pulse. By obviating the need for pairs of adiabatic refocusing pulses for each spatial dimension, the use of adiabatic SPSP pulses to select the volume of interest may be used to reduce total SAR when compared to semi-LASER.

Hyperbolic secant adiabatic pulses have been used as spectral envelopes to create the adiabatic SPSP pulses. This approach, however, resulted in a spectral bandwidth limited by peak radiofrequency, necessitating a spectrally interleaved approach to cover the full range of interesting brain metabolites.

SUMMARY

A method for producing a semi-adiabatic spectral-spatial spectroscopic imaging sequence for magnetic resonance imaging. A pulse control signal comprising a pair of adiabatic pulses and a linear phase pulse is generated by a magnetic resonance imaging computing device. The pulse control signal is transformed into a pair of spectral-spatial refocusing pulses and an excitation pulse. The pair of spectral-spatial refocusing pulses and the excitation pulse are output to a waveform generator to produce the semi-adiabatic spectral-spatial spectroscopic imaging sequence.

A magnetic resonance imaging computing device includes at least one processor and a memory coupled to the processor which is configured to be capable of executing programmed instructions comprising and stored in the memory to generate pulse control signal comprising a pair of adiabatic pulses and a linear phase pulse. The pulse control signal is transformed into a pair of spectral-spatial refocusing pulses and an excitation pulse. The pair of spectral-spatial refocusing pulses and the excitation pulse are output to a waveform generator to produce the semi-adiabatic spectral-spatial spectroscopic imaging sequence.

A non-transitory computer readable medium having stored thereon instructions for producing a semi-adiabatic spectral-spatial spectroscopic imaging sequence for magnetic resonance imaging comprises executable code which when executed by a processor, causes the processor to perform steps including generating a pulse control signal comprising a pair of adiabatic pulses and a linear phase pulse is generated. The pulse control signal is transformed into a pair of spectral-spatial refocusing pulses and an excitation pulse. The pair of spectral-spatial refocusing pulses and the excitation pulse are output to a waveform generator to produce the semi-adiabatic spectral-spatial spectroscopic imaging sequence.

This technology provides a number of advantages including providing more effective methods and devices for producing a semi-adiabatic spectral-spatial spectroscopic imaging sequence for magnetic resonance imaging. This exemplary method utilizes a Semi-Adiabatic Spectral-Spatial Spectroscopic Imaging (SASSI) pulse sequence to provide more uniform spectral data at 7 T with reduced SAR. The SASSI pulse sequence produces spectra with higher and more uniform brain metabolite ratio when compared to the conventional non-adiabatic MRSI sequence. SASSI further achieved comparable signal to noise ratios to the current adiabatic alternative, semi-LASER, but with ⅓ of the SAR.

DETAILED DESCRIPTION

Figure 1:
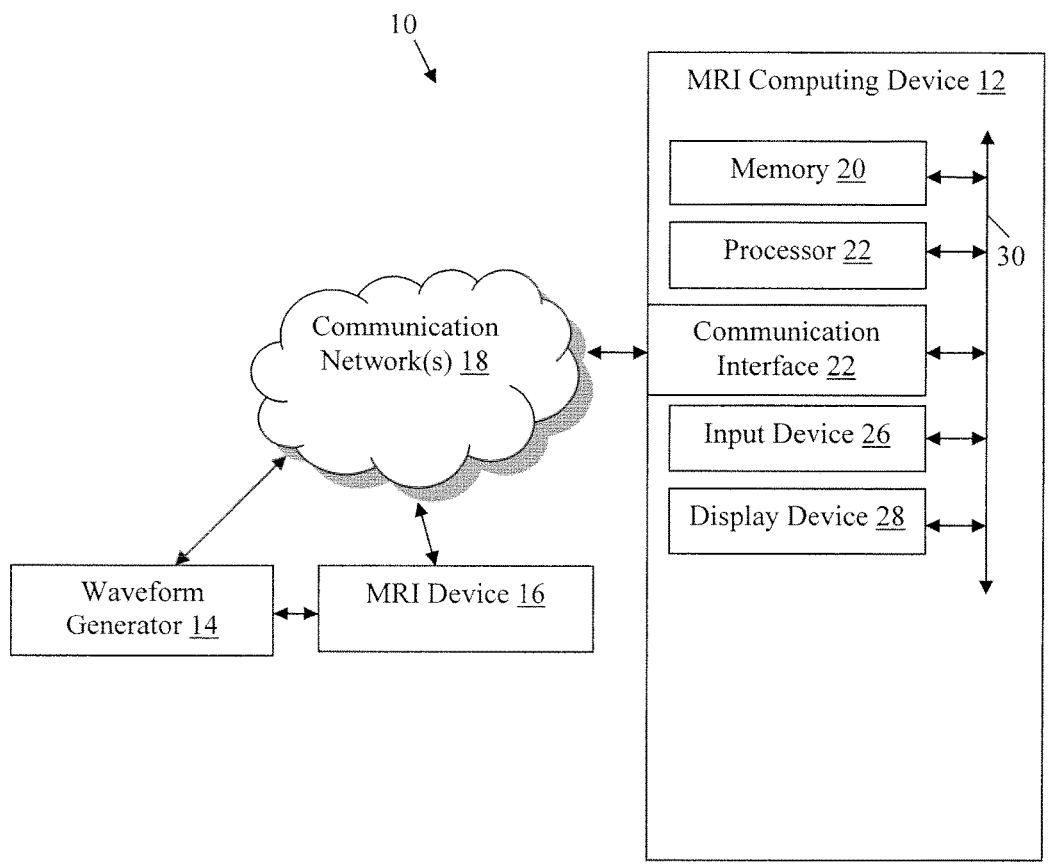
FIG. 1 is an exemplary environment including a magnetic resonance imaging computing device of the present technology.

An exemplary environment 10 including a magnetic resonance imaging (MRI) computing device 12 coupled to a wave generator 14, which is in communication with an MRI device 16, by communication network(s) 18 is illustrated in FIG. 1. While not shown, the environment also may include additional components whose connections and operations are well known to those of ordinary skill in the art of magnetic resonance imaging and thus will not be described here. This technology provides a number of advantages including methods, non-transitory computer readable media, and devices that more effectively generate a semi-adiabatic spectral-spatial spectroscopic imaging (SASSI) sequence for magnetic resonance imaging.

Referring more specifically to FIG. 1, the MRI computing device 12 in this example is configured to be capable of providing a pulse control signal to produce a pulse pair sequence as illustrated and described with examples of the methods described herein. The MRI computing device 12 includes at least a processor 20, a memory 22, a communication interface 24, an input device 26, and a display device 28, which are coupled together by a bus 30 or other communication link, although other numbers and types of systems, devices, components, and elements in other configurations and locations can be used.

The processor 20 in the MRI computing device 12 executes a program of instructions stored in the memory for one or more aspects of the present technology, although other numbers and types of systems, devices, components, and elements in other configurations and locations can be used. The communication interface 24 of the MRI computing device 12 is used to operatively couple and communicate between the MRI computing device 12 and the waveform generator 14 via a communication network or other communication link, although the communications network(s) could also be used in other examples and other types and numbers of communication networks or systems with other types and numbers of connections and configurations can be used.

The memory 22 in the magnetic resonance imaging computing device stores these programmed instructions for one or more aspects of the present technology, although some or all of the programmed instructions could be stored and/or executed elsewhere. A variety of different types of memory storage devices, such as a random access memory (RAM), read only memory (ROM), hard disk, CD ROM, DVD ROM, or other computer readable medium which is read from and written to by a magnetic, optical, or other reading and writing system that is coupled to the processor 20, can be used for the memory 22.

The communication interface 24 of the MRI computing device 12 is used to operatively couple and communicate between the MRI computing device 12 and the waveform generator 14 and the MRI device 16 via the communications network(s) 18, although other types and numbers of communication networks, systems, or other links with other types and numbers of connections and configurations can be used. By way of example only, the communications network could use TCP/IP over Ethernet and industry-standard protocols, including NFS, CIFS, SOAP, XML, LDAP, and SNMP, although other types and numbers of communication networks, such as a direct connection, a local area network, a wide area network, modems and phone lines, e-mail, and wireless communication technology, each having their own communications protocols, can be used.

The input 26 and display devices 28 of the MRI computing device 12 enable a user to interact with the MRI computing device 12, such as to input and/or view data and/or to configure, program, and/or operate the MRI computing device 12 by way of example only. The input device 26 may include a keyboard, computer mouse, and/or touch screen and the display device 28 may include a computer monitor, although other types and numbers of input devices and/or display devices could also be used in other examples.

The waveform generator 14 is a standard waveform generator capable of producing radiofrequency pulses in accordance with the examples of methods illustrated and described herein. The MRI device 16 is a standard magnetic resonance imaging device, such as, by way of example only a 7 T actively shielded whole body MRI scanner (Siemens MAGNETOM 7 T, Siemens, Erlangen), equipped with a SC72CD gradient coil (Gmax=70 mT/m and max slew rate=200 T/m/s), using a single channel transmitter and a 32-channel receive head coil (Nova Medical, Wilmington, Mass.).

Although an example of the MRI computing device 12, is described herein, this system can be implemented on any suitable computer system or computing device. It is to be understood that the devices and systems of the examples described herein are for exemplary purposes, as many variations of the specific hardware and software used to implement the examples are possible, as will be appreciated by those skilled in the relevant art(s).

Aspects of the examples may also be embodied as a non-transitory computer readable medium having instructions stored thereon for one or more aspects of the present technology as described and illustrated by way of the examples herein, as described herein, which when executed by a processor, cause the processor to carry out the steps necessary to implement the methods of the examples, as described and illustrated herein.

Exemplary methods, non-transitory computer readable medium, and devices for producing a pulse pair in accordance with the present technology will now be described herein.

Figure 2:
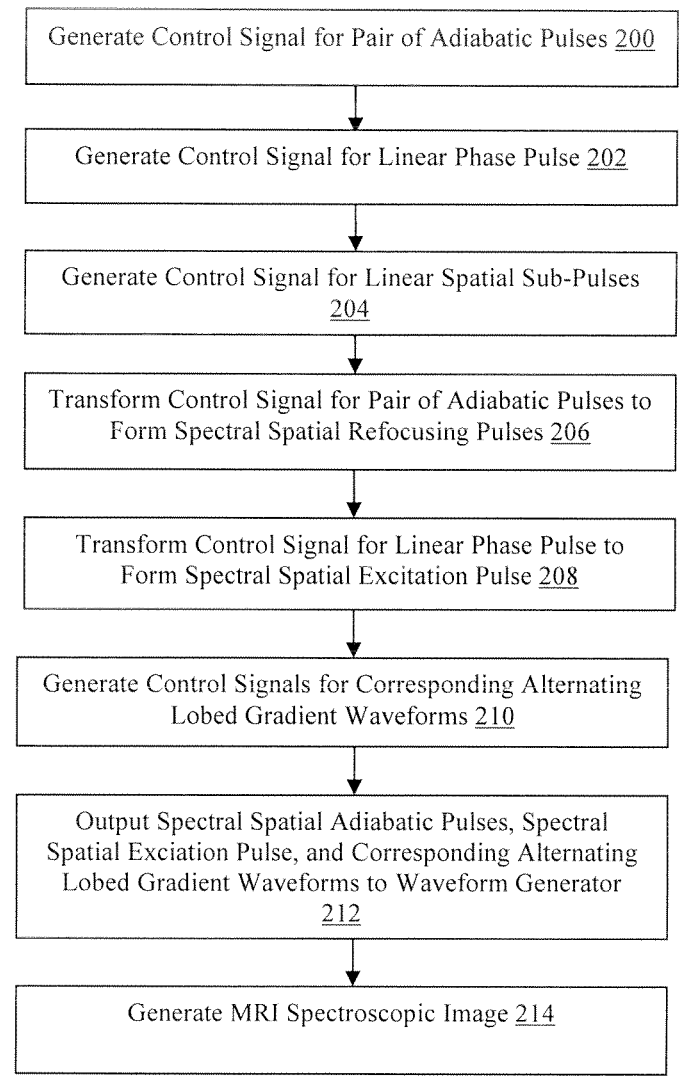
FIG. 2 is a flowchart illustrating a method for producing a semi-adiabatic spectral-spatial spectroscopic imaging sequence for magnetic resonance imaging in accordance with the present technology.

Referring now to FIG. 2, a flowchart of an example of a method for developing a semi-adiabatic spectral-spatial spectroscopic imaging (SASSI) sequence is illustrated. In step 200, the MRI computing device 12 generates a control signal for the waveform generator 14 to generate a pair of adiabatic radiofrequency pulses, although other types and numbers of radiofrequency pulses may be generated using the MRI computing device. By way of example only, the pair of adiabatic pulses may be generated using a MATLAB script as produced by the Mathworks, Inc., Natick, Mass., although other scripts capable of generating the pair of adiabatic pulses may be utilized.

The control signal to produce the adiabatic radiofrequency pulses may be generated using the Shinnar Le-Roux algortighm as described in Pauly et al., "Parameter Relations for the Shinnar-Le Roux Selective Excitation Pulse Design Algorithm [NMR imaging]," IEEE Trans Med Imaging 10(1):53-65 (1991) and Balchandani et al., "Designing Adiabatic Radio Frequency Pulses Using the Shinnar-Le Roux Algorithm," Magn Reson Med 64(3):843-851 (2010), the disclosures of which are hereby incorporated by reference herein in their entirety, although other methods may be utilized. In this example, the adiabatic pulses are 180 degree pulses with a spectral bandwidth of 1.02 kHz, although other adiabatic pulses having other parameters may be utilized. In this example the spectral bandwidth is selected to capture metabolites of interest at a magnetic field strength of 7 T for example. Specifically, by way of example only, the spectral bandwidth may be selected to cover the frequency range containing the metabolites myo-inositol (MI), choline (Cho), creatine (Cre), and n-acetylaspartate (NAA), while achieving partial water suppression. The adiabatic pulses act as the spectral envelope for the generated spectral spatial pulses as described below.

The frequency profile of the adiabatic 180° pulse is the response of a least-squares linear-phase filter set to have the desired bandwidth. In order to introduce adiabatic behavior and distribute RF energy more uniformly, quadratic phase may be applied across the frequency response for the filter as described in Balchandani et al., "Designing Adiabatic Radio Frequency Pulses Using the Shinnar-Le Roux Algorithm," Magn Reson Med 64(3):843-851 (2010), which is hereby incorporated by reference herein in its entirety. According to one example, the the B(z) polynomial may then be calculated as the Fourier transform of the resultant frequency profile and an A(z) polynomial may be calculated from B(z) polynomial. The A(z) and B(z) polynomials may be used as inputs for the inverse SLR transform to produce the adiabatic radiofreqency pulse envelopes.

Next, in step 202 the MRI computing device 12 generates another control signal for the waveform generator 14 to provide a linear phase pulse. In this example the linear phase pulse is a 90 degree pulse that acts a spectral envelope for the generated 90 degree spectral spatial pulses as described below. In this example, the spectral bandwidth of the linear phase pulse slight exceeds the spectral bandwidth of the adiabatic pulses. By way of example only, the linear phase pulse may have a spectral bandwidth of 1.05 kHz.

In step 204, the MRI computing device 12 generates another control signal for the waveform generator 14 to provide a plurality of linear spatial sub-pulses. In this example, the linear spatial sub-pulses are generated with a spectral bandwidth of 8.96 kHz and small tip angles, although other sub-pulses with other characteristics may be utilized.

Figures 4A, 4B, 4C, 4D:
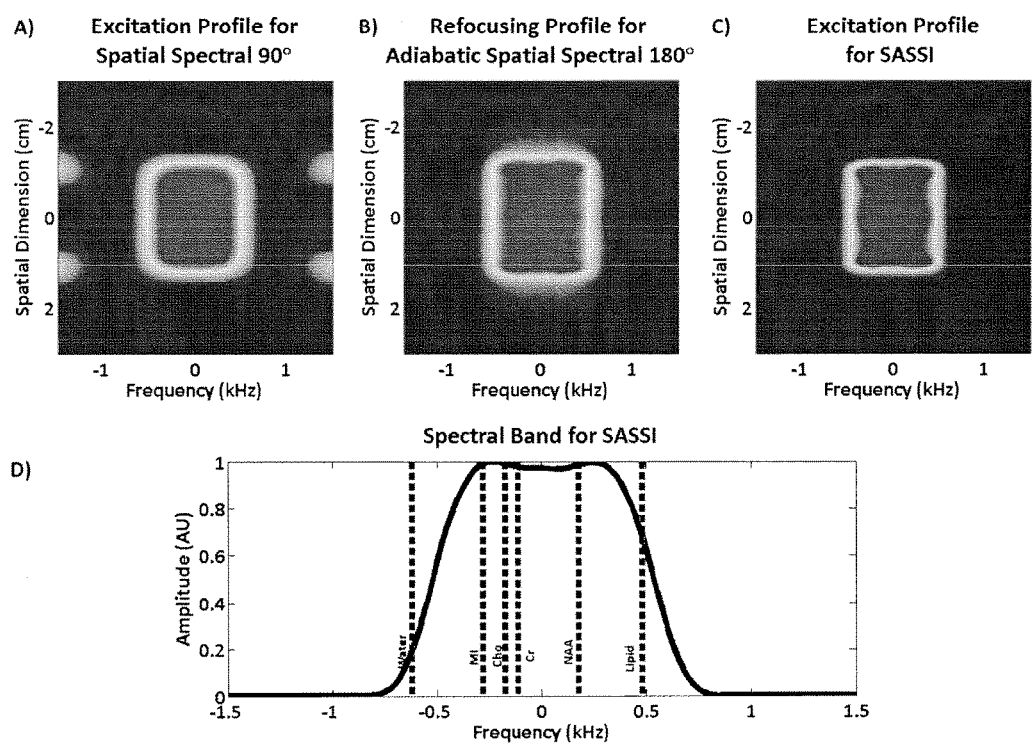
FIGS. 4A-4D illustrate simulated 2D spectral-spatial excitation for the SASSI SPSP excitation pulse, showing both the frequency and spatial selectivity of the pulse (FIG. 4A); simulated 2D spectral-spatial refocusing profile at adiabatic threshold for the SASSI adiabatic refocusing pulses (FIG. 4B); simulated 2D spectral-spatial refocusing profile for the entire SASSI pulse (FIG. 4C); and spectral profile of the SASSI adiabatic refocusing pulses versus frequency showing relative resonant frequencies of important in vivo brain metabolites at 7 T (FIG. 4D).

Next, in step 206 the MRI computing device 12 transforms the control signal for the generated pair of adiabatic pulses to form spectral spatial (SPSP) refocusing pulses. The adiabatic SPSP 180 degree refocusing pulses are generated, by way of example, by sampling the adiabatic 180 degree pulse pair utilizing a comb function, although other sampling techniques may be utilized. The comb function creates evenly spaced nulls in the pulse waveform interleaved between radiofrequency pulse samples or lobes. In this example, the adiabatic 180 degree pulse is sampled at twenty-seven evenly spaced locations, although other numbers of spaces may be utilized for the sampling. Further, the sampled 180 degree adiabatic pulses are utilized to scale a first set of the linear phase spatial sub-pulses. Scaling the first set of linear phase spatial sub-pulses with the sampled 180 degree adiabatic pulses creates, in one example, 180 degree spectral spatial adiabatic pulses with a spectral bandwidth of 1.02 kHz, a spatial bandwidth of 9.19 kHz, a duration of 9.8 ms, and a peak radiofrequency amplitude of 14.36 μT, although other spectral spatial adiabatic pulses with other parameters may be generated. FIG. 4B illustrates a simulated two-dimensional spectral-spatial refocusing pulse profile at adiabatic threshold for exemplary SASSI adiabatic refocusing pulses. FIG. 4D illustrates the spectral profile of the SASSI adiabatic refocusing pulses versus frequency showing relative resonant frequencies of important in vivo brain metabolites at 7 T.

In step 208, the MRI computing device 12 transforms the control signal for the generated linear phase pulse to form a spectral spatial (SPSP) excitation. The SPSP 90 degree excitation pulse is generated, by way of example, by sampling the linear phase 90 degree pulse utilizing a comb function as described above, although other sampling techniques may be utilized. In this example, the linear phase 90 degree pulse is sampled at eighteen evenly spaced locations, although other numbers of samples may be utilized for the sampling. The sampled 90 degree linear phase pulse is utilized to scale a second set of the linear phase spatial sub-pulses. Scaling the second set of linear phase spatial sub-pulses with the sampled 90 degree pulses creates, in one example, a 90 degree spectral spatial linear phase pulse with a spectral bandwidth of 1.05 kHz, a duration of 4.2 ms and peak amplitude of 16.61 µT, although other spectral spatial linear phase pulses with other parameters may be generated. FIG. 4A illustrates a simulated two-dimensional spectral-spatial excitation for an exemplary SASSI SPSP 90 degree excitation pulse, showing both the frequency and spatial selectivity of the pulse.

Next, in step 210, the MRI computing device 12 generates control signals for the waveform generator 14 to create alternating lobed gradient waveforms corresponding to the spectral spatial adiabatic pulses and the spectral spatial linear phase pulse. In this example, the generated control signals for the alternating lobed gradients are generated to match the sub-pulse duration in the spectral spatial adiabatic pulses and the spectral spatial linear phase pulse.

In step 212, the MRI computing device 12 outputs the completed control signals for the pulse trio, which includes the spectral spatial adiabatic 180 degree pulses and the spectral spatial linear phase 90 degree pulse, with the associated control signals for the alternating lobed gradients, to the waveform generator 14 to be inserted into a spin echo pulse sequence to create the semi-adiabatic spectral-spatial spectroscopic imaging (SASSI) sequence using the MRI device 16 using known techniques. In this example, the spectral spatial adiabatic 180 degree pulses and the spectral spatial linear phase 90 degree pulse are integrated in a point resolved spectroscopy (PRESS) sequence utilizing the spectral spatial linear phase 90 degree pulse as an excitation pulse followed by the spectral spatial adiabatic 180 degree pulses.

The spectral spatial adiabatic 180 degree pulses and the spectral spatial linear phase 90 degree pulse are further coupled with the alternating lobed gradient waveforms. The variable rate selective excitation (VERSE) transformation, as described in [PLEASE INDICATE REFERENCES], the disclosures of which are hereby incorporated herein by reference in their entirety, is applied to compensate for the RF pulse and gradient ramp overlap. The PRESS sequence utilizes the pulses, along with the gradient waveforms, in a semi-adiabatic spectral-spatial spectroscopic imaging sequence to select along three spatial dimensions to form a double spin echo over a volume of interest, although the pulses may be employed in other types of sequences using the MRI device 16.

Figure 3A:
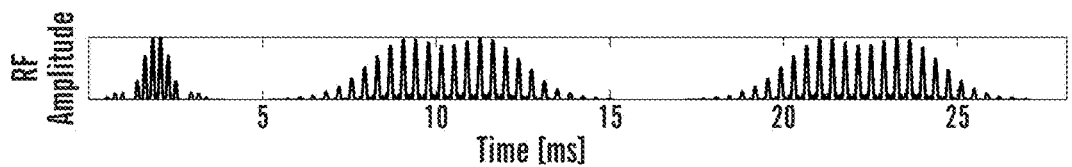
FIG. 3A-3E illustrate an SASSI Pulse sequence diagram showing the amplitude (FIG. 3A) and phase (FIG. 3B) of the SPSP excitation pulse followed by the adiabatic SPSP refocusing pulses and the associated gradient waveforms (FIGS. 3C-3E).
Figure 3B:
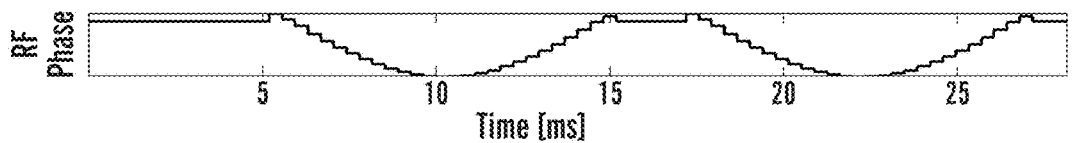
Figure 3C:
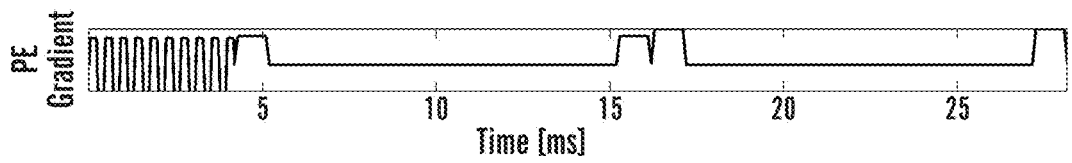
Figure 3D:
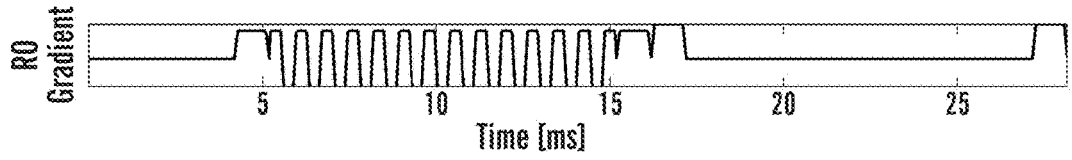
Figure 3E:
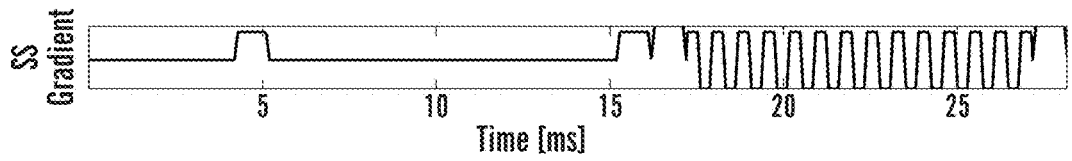

Referring now to FIGS. 3A-3E an exemplary SASSI pulse sequence diagram is illustrated. The amplitude and phase for an exemplary pulse trio including the spectral spatial linear phase 90 degree pulse as an excitation pulse followed by the spectral spatial adiabatic 180 degree refocusing pulses are shown in FIGS. 3A and 3B respectively, while the associated gradient waveforms are illustrated in FIGS. 3C-3E. A period of signal acquisition (not shown) would follow the exemplary SASSI pulse sequence. FIG. 4C illustrates the simulated two-dimensional spectral-spatial refocusing profile for an entire exemplary SASSI pulse.

The double spin echo SASSI imaging sequence may then be utilized, in step 214, after a period of signal acquisition to generate an MRI image using known MRI techniques. The SASSI sequence may be utilized to generate the MRI image at high field strengths, such as 7 T, by way of example only. High magnetic fields, such as 7 T, provide increased signal to noise ratio (SNR) and spectral separation between metabolite peaks for more sensitive metabolite detection and quantification as well as higher resolution spectral grids. The SASSI sequence may be utilized, by way of example, to generate an MRI image to provide spectroscopic imaging to non-invasively measure metabolite concentrations, such as myo-inositol (MI), choline (Cho), creatine (Cre), and n-acetylaspartate (NAA), in the brain.

The SASSI sequence provides more uniform spectral data at high field strengths, e.g., 7 T, with reduced SAR. The SASSI pulse sequence further produces spectra with higher and more uniform brain metabolite ratio when compared to the conventional non-adiabatic MRSI sequence. The SASSI further provides comparable signal to noise ratios to the current adiabatic alternative, semi-LASER, but with ⅓ of the SAR.

EXAMPLES

The following examples are merely intended to illustrate practice of examples of the technology, and are not intended to limit the scope of the claimed technology.

Simulations as well as phantom and in vivo results, demonstrate multi-slice capability and improved $B_1$-insensitivity of the SEAMS PINS pulse-pair when operating at RF amplitudes of up to 40% above adiabatic threshold.

Methodology

The frequency responses of the ASASSI90(z) and BSASSI180(z) polynomials were used to simulate the magnetization profiles for the SASSI excitation and refocusing pulses and used to calculate the final magnetization profile for the double spin echo generated by the pulse trio as given in Equations 1-3.

$$M_{xy} = 2\text{conj}(A_{SASSI90}(z)) * B_{SASSI90}(z) \quad (1)$$

$$M_{ref} = B_{SASSI180}(z) * B_{SASSI180}(z) \quad (2)$$

$$M_{fin} = \text{conj}(\text{conj}(M_{xy})M_{ref})M_{ref} \quad (3)$$

Where $M_{xy}$ is the transverse magnetization after the initial excitation by the line phase 90 degree SPSP pulse and $M_{ref}$ is the refocusing profile for the adiabatic SPSP 180 degree pulses. The final magnetization ($M_{fin}$) at the second spin echo can be calculated as the effect of the two 180 degree SPSP pulses on the transverse magnetization produced by the 90 degree SPSP pulse (Equation 3), as described in Pauly et al., "Parameter Relations for the Shinnar-Le Roux Selective Excitation Pulse Design Algorithm [NMR imaging]," *IEEE Trans Med Imaging* 10(1):53-65 (1991), the disclosure of which is incorporated herein by reference in its entirety.

Figure 5A:
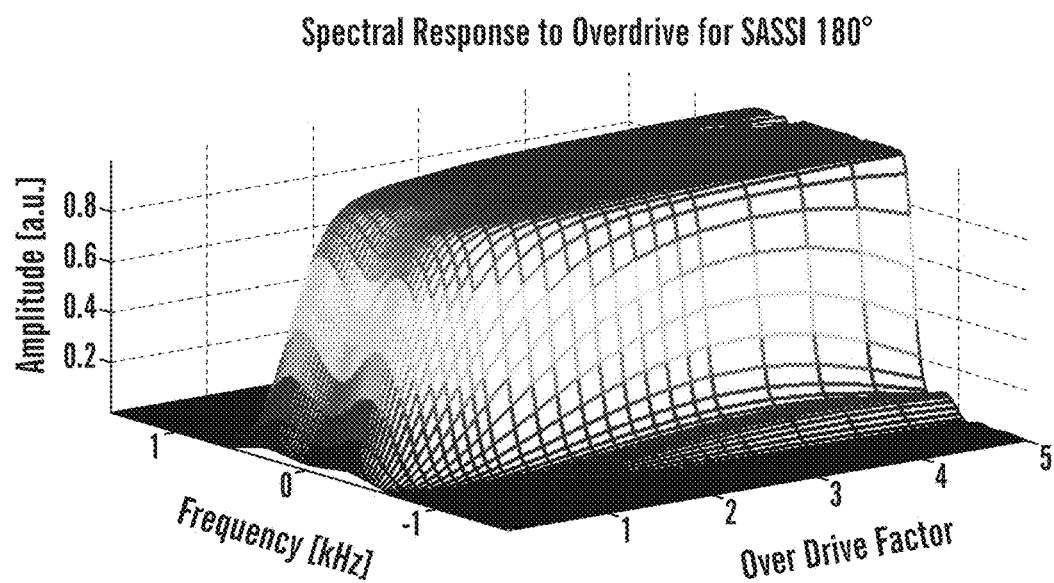
FIGS. 5A and 5B illustrate a simulated response of the spectral profile (FIG. 5A) spatial profile (FIG. 5B) of an exemplary SASSI SPSP adiabatic 180 degree pulses.
Figure 5B:
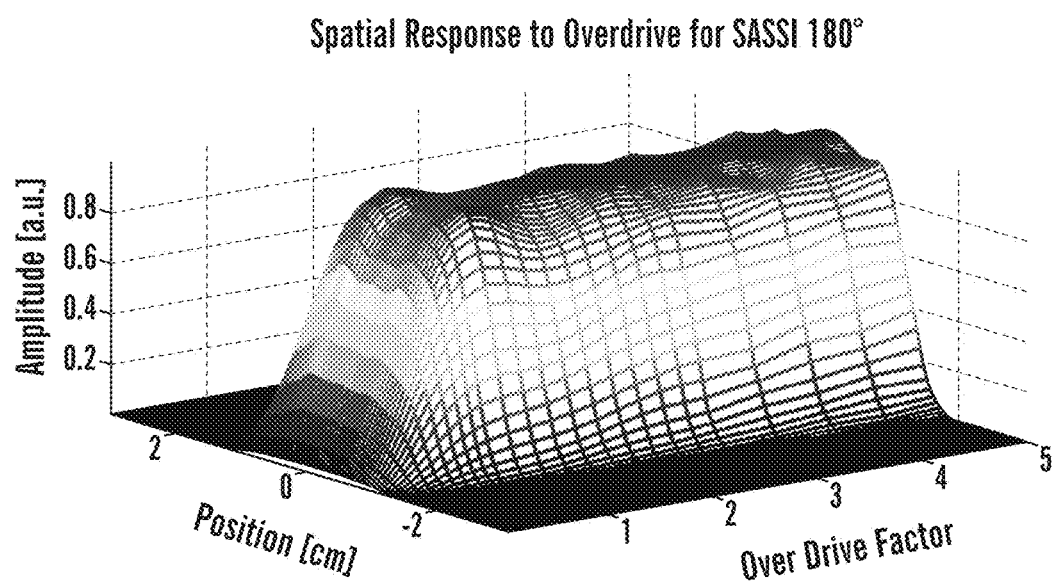

The spectral-spatial profile of the excitation pulse (Equation 1) and the refocusing pulses (Equation 2), as well as the final spectral-spatial profile and a spectral cross-section of that profile (Equation 3) were simulated and are shown in FIGS. 4A-4C. The $B_1$-insensitivity of the SASSI pulse was investigated as illustrated in FIGS. 5A and 5B, by simulating the spectral and spatial profiles for radiofrequency overdrive factors (ODF) ranging for 0.5-5, in increments of 0.25. The radiofrequency overdrive factor is equal to the RF amplitude of the applied pulse ($A_{app}$) divided by the radiofrequency amplitude of the pulse at nominal power or adiabatic threshold ($A_{thresh}$), as illustrated in Equation 4.

$$ODF = \frac{A_{app}}{A_{thresh}} \quad (4)$$

All experiments were performed on a 7 T whole body MRI scanner (Siemens MAGNETOM 7 T, Siemens, Erlangen), equipped with a SC72CD gradient coil ($G_{max}$=70 mT/m and max slew rate=200 T/m/s), using a single channel transmitter and a 32-channel receive head coil (Nova Medical, Wilmington, Mass.).

The performance of the SASSI pulse imaging sequence was verified using a spherical water and metabolite phantom prepared following the GE "BRAINO" phantom recipe (GE Medical Systems, Milwaukee, Wis. USA) to mimic in vivo brain metabolite ratios. The BRAINO phantom was imaged using three 7 T spectroscopic imaging sequences: 1) a conventional double spin echo PRESS sequence; 2) a semi-LASER sequence using pairs of identical adiabatic refocusing pulses to select along two spatial dimensions (for a total of 4 adiabatic pulses); and 3) the SASSI sequence. The TR for the sequences was set to be 2050 ms and was chosen based on the minimum TR possible for the semi-LASER sequence and was dictated by system SAR limitations. The acquisition parameters for the phantom MRSI scans were: slice thickness=1.6 cm, FOV=12×12 cm, matrix size=32×32 (16×16 voxels within the PRESS box), voxel volume=6.75 cc, TE/TR=42/2050 ms, $N_{avg}$=1, scan time=28:03 min with a weighted partial acquisition. The center frequency for the pulse was set to −2.6 ppm, chosen to be between NAA and Cho resonances to distribute CSL error as evenly as possible between the metabolites of interest. Receiver gains were set to the same value for all three acquisitions in order to enable comparison of metabolite signal amplitudes between sequences.

The SASSI sequence was tested in vivo by exciting a single slice through the brain of a normal volunteer and comparing the results to those obtained using the semi-LASER sequence and a PRESS sequence. Institutional Review Board approval and informed consent were obtained prior to scanning. The acquisition parameters for the in vivo MRSI scans were: slice thickness=1.6 cm, FOV=8×8 cm, matrix size=8×8 pixels (6×6 pixels within the PRESS box), pixel volume=1.6 cc, TE/TR=42/4080 ms, $N_{avg}$=16, scan time=13:21 min with a weighted partial acquisition. As in the phantom experiments, the center frequency was set to −2.6 ppm. Finally, higher-resolution in vivo acquisitions were done in 3 subjects with SASSI with the following parameters: slice thickness=1.6 cm, FOV=8×8 cm, matrix size=10×10 pixels (8×8 pixels within the PRESS box), pixel volume=1.0 cc, TE/TR=42/1500 ms, $N_{avg}$=20, scan time=10:14.

MRSI reconstruction, including channel-combination, was performed by the scanner software (Spectroscopy task card of the Siemens Syngo MR software). The MRSI data was then extracted for further spectral processing using LCModel (LCMODEL Inc, Oakville, Ontario, Canada). Each pixel in the field of view was corrected for frequency shift using the NAA peak at 2.02 ppm. Spectra were analyzed using a basis set to fit curves for the peaks for the metabolites myo-inositol (MI), choline (Cho), creatine (Cre), and n-acetylaspartate (NAA). The area under the fitted peaks was used to produce the metabolite maps shown in FIGS. 6A-6F (phantom) and FIGS. 8A-8F (in vivo) and the spectra shown in FIGS. 7A-7H (phantom) and FIGS. 9A-9H (in vivo).

Results

Phantom and in vivo experiments demonstrated the improved $B_1$-insensitivity and immunity to chemical shift localization error of SASSI when compared to conventional PRESS and substantially reduced specific absorption rate and further reduction of chemical shift localization error when compared to the currently available adiabatic alternative, semi-LASER.

The signal to noise ratio of the integral under the fitted NAA and Cr metabolite peaks are listed in Table 1.

|  |  | Anterior | | | Medial | | | Posterior | | |
| --- | --- | --- | --- | --- | --- | --- | --- | --- | --- | --- |
|  |  | NAA SNR | Cr SNR | NAA Cr | NAA SNR | Cr SNR | NAA Cr | NAA SNR | Cr SNR | NAA Cr |
| phantom | PRESS | 0 ± 0% | 11 ± 4% | 0.000 | 16 ± 5% | 15 ± 5% | 1.068 | 15 ± 3% | 08 ± 5% | 1.705 |
|  | semi-LASER | 05 ± 8% | 16 ± 8% | 0.300 | 17 ± 5% | 13 ± 6% | 1.269 | 17 ± 5% | 11 ± 8% | 1.601 |
|  | SASSI | 20 ± 5% | 16 ± 6% | 1.225 | 18 ± 6% | 15 ± 5% | 1.195 | 17 ± 4% | 14 ± 5% | 1.173 |
| in vivo | PRESS | 09 ± 4% | 07 ± 6% | 1.228 | 11 ± 4% | 07 ± 5% | 1.559 | 15 ± 3% | 09 ± 4% | 1.715 |
|  | semi-LASER | 09 ± 4% | 07 ± 4% | 1.339 | 13 ± 4% | 08 ± 4% | 1.537 | 18 ± 4% | 11 ± 3% | 1.625 |
|  | SASSI | 16 ± 2% | 11 ± 2% | 1.482 | 18 ± 2% | 12 ± 3% | 1.459 | 16 ± 2% | 12 ± 3% | 1.366 |

Table 1 also lists the specific absorption rate of each sequence, relative to the most specific absorption rate intensive sequence, semi-LASER. The sequence parameters were chosen to allow semi-LASER to run without interruption due to specific absorption rate safety constraints. Thus the PRESS sequence and SASSI were both running below specific absorption rate constraints. For comparison, all three sequences were operated with sequence parameters including TR, chosen such that the most specific absorption rate intensive sequence (semi-LASER) operated at the specific absorption rate limit (100%). With these parameters, the power deposited by the PRESS sequence was 17% of the specific absorption rate limit, while the power deposited by the SASSI pulse was 34% of the specific absorption rate limit.

The metabolite maps for NAA and Cr generated from the BRAINO phantom by the SASSI (FIGS. 6A and 6D), semi-LASER (FIGS. 6B and 6E), and PRESS sequences (FIGS. 6C and 6F) are shown collectively in FIGS. 6A-6F. The sensitivity of the standard PRESS sequence to $B_1$ variation results in the signal loss seen in FIGS. 6B and 6F. The radiofrequency power was set to produce excitation and refocusing at the center of the PRESS box, however peak $B_1$ occurs at the center of the phantom, resulting in poor refocusing (angles>180 degree) in the anterior region of the PRESS. Although the SASSI (FIGS. 6A and 6D) and semi-LASER (FIGS. 6B and 6E) show some signal inhomogineity, the refocusing pulses are insensitive to $B_1$ variation preventing the signal to noise loss that occurred in standard PRESS and resulting in more uniform signal to noise across the PRESS box.

A spatial shift in both the anterior-posterior (A-P) direction (vertical axis of the image) and lateral right-left (R-L) direction (horizontal axis of the image) is visible between the NAA metabolite map and the Cr metabolite map for both the semi-LASER and PRESS sequences. Therefore both sequences suffer from different degrees of chemical shift localization error due to the limited bandwidth of the pulses used for selection in those spatial dimensions. The PRESS sequence suffered from the most severe chemical shift localization error, with spatial shifts of approximately 4 voxels (25%) in the A-P dimension and 2 voxels (12.5%) in the R-L dimension for NAA, and approximately 2 voxels (12.5%) in the A-P dimension and 1 voxel (6.25%) in the R-L dimension for Cr. Although the semi-LASER sequence uses higher bandwidth adiabatic pulses to select in at least one of the spatial dimensions, there is still some chemical shift localization error affecting the volume of interest. Spatial shifts for the semi-LASER sequence were approximately 2 voxels (12.5%) in the A-P dimension and 1 voxel (6.25%) in the R-L dimension for NAA, and approximately 1 voxle (6.25%) in the A-P dimension and 1 voxel (6.25%) in the R-L dimension for the Cr. Due to the high bandwidth spatial subpulses used in the SASSI sequence, the chemical shift localization error is less than 1 voxel over the resolution and extent of the grid obtained in this experiment.

The signal to noise ratio for both NAA and Cr obtained using the SASSI sequence were more consistent between the edge and middle voxels than those obtained for PRESS and semi-LASER demonstrating more uniform and complete coverage provided by SASSI.

Figures 6A, 6B, 6C, 6D, 6E, 6F:
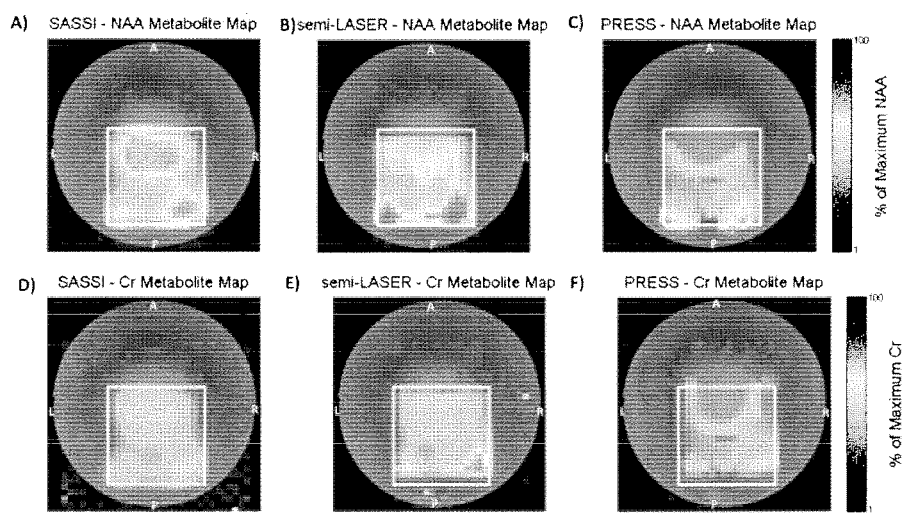
FIGS. 6A-6F illustrate metabolite maps acquired on a slice of the BRAINO phantom using SASSI (FIGS. 6A and 6D), semi-LASER (FIGS. 6B and 6E), and PRESS (FIGS. 6C and 6F) for the metabolites NAA and Cr.
Figure 7A:
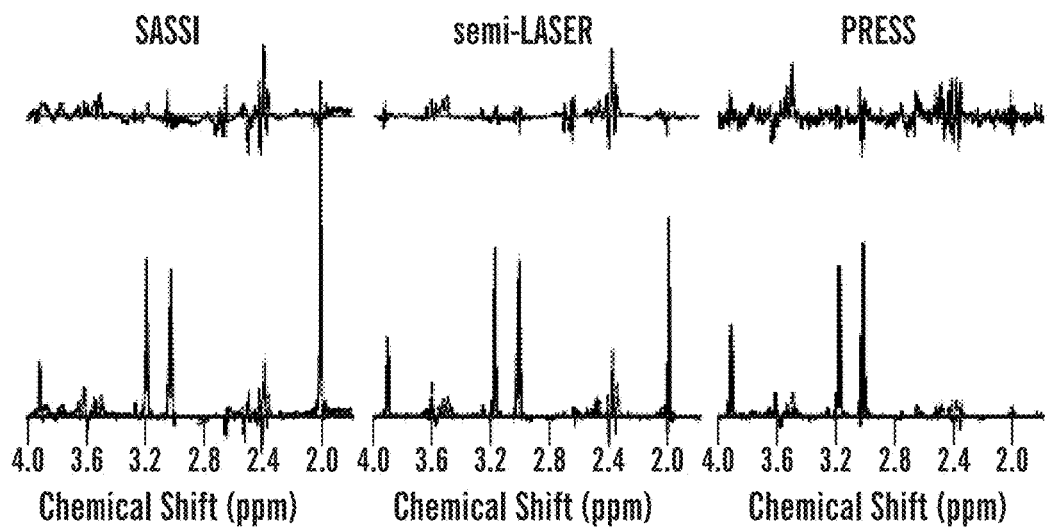
FIGS. 7A-7H illustrate metabolite spectra obtained using SASSI, semi-LASER, and PRESS sequences from several locations in the selected grid.
Figure 7B:
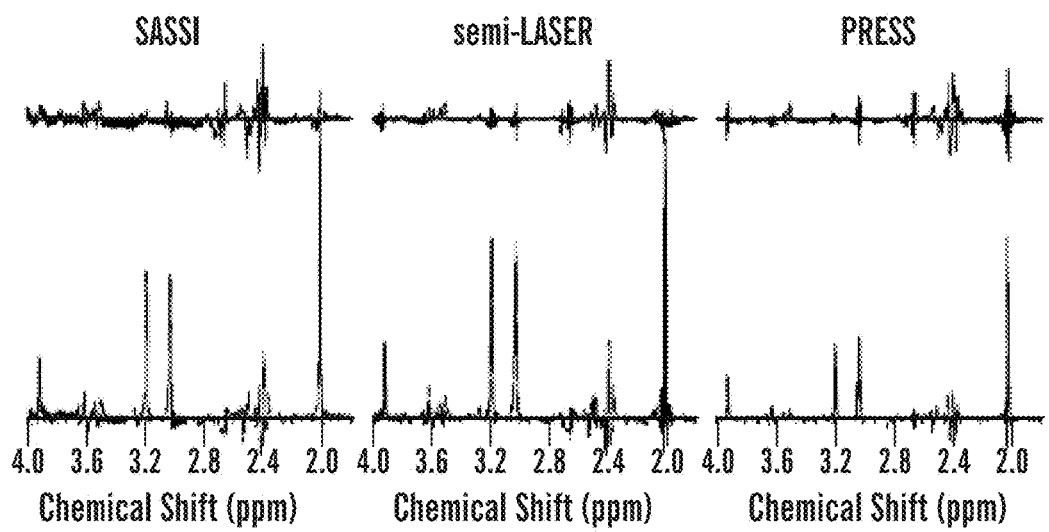
Figure 7C:
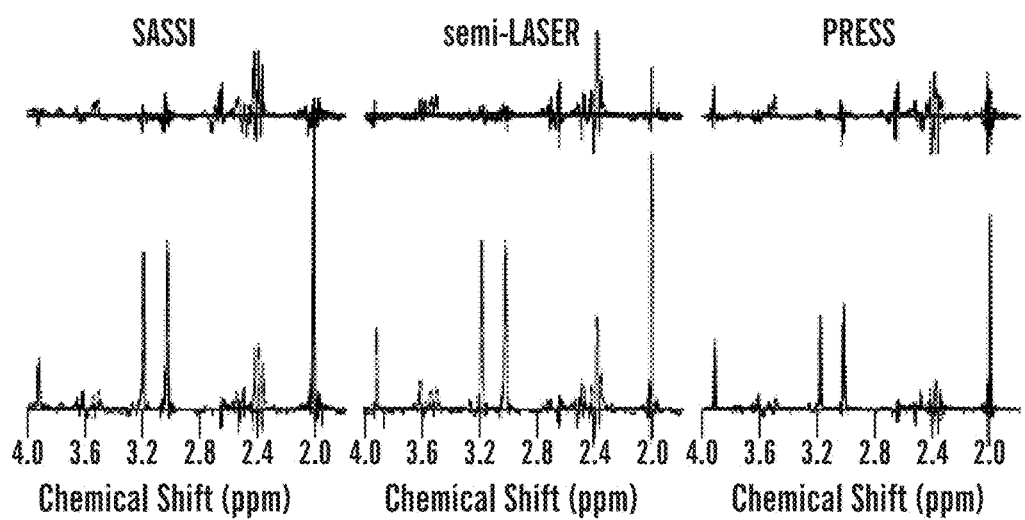
Figure 7D:
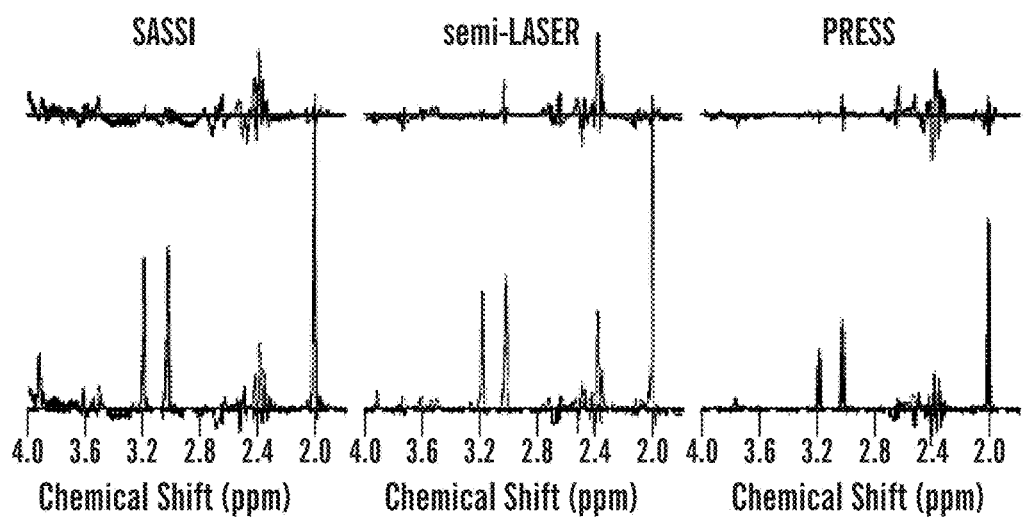
Figure 7E:
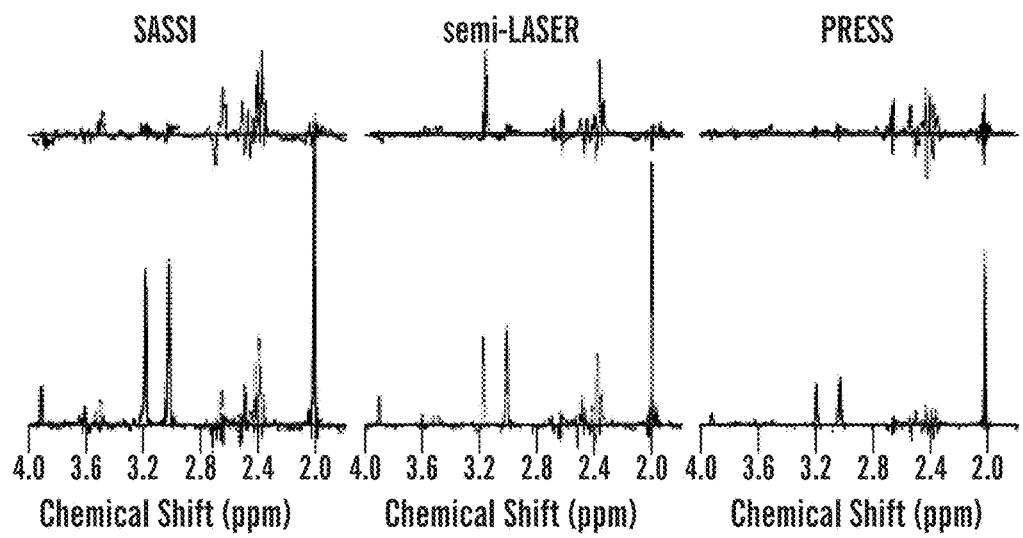
Figure 7F:
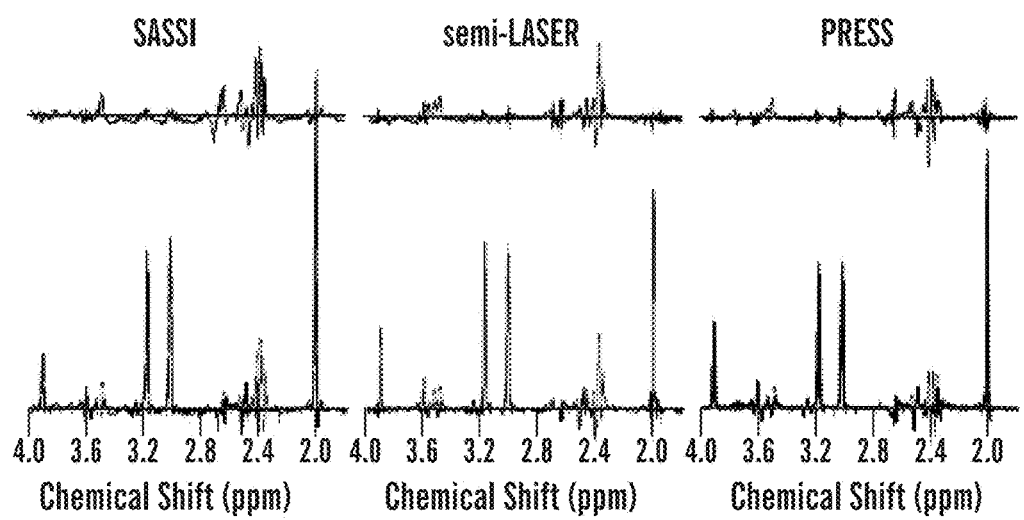
Figure 7G:
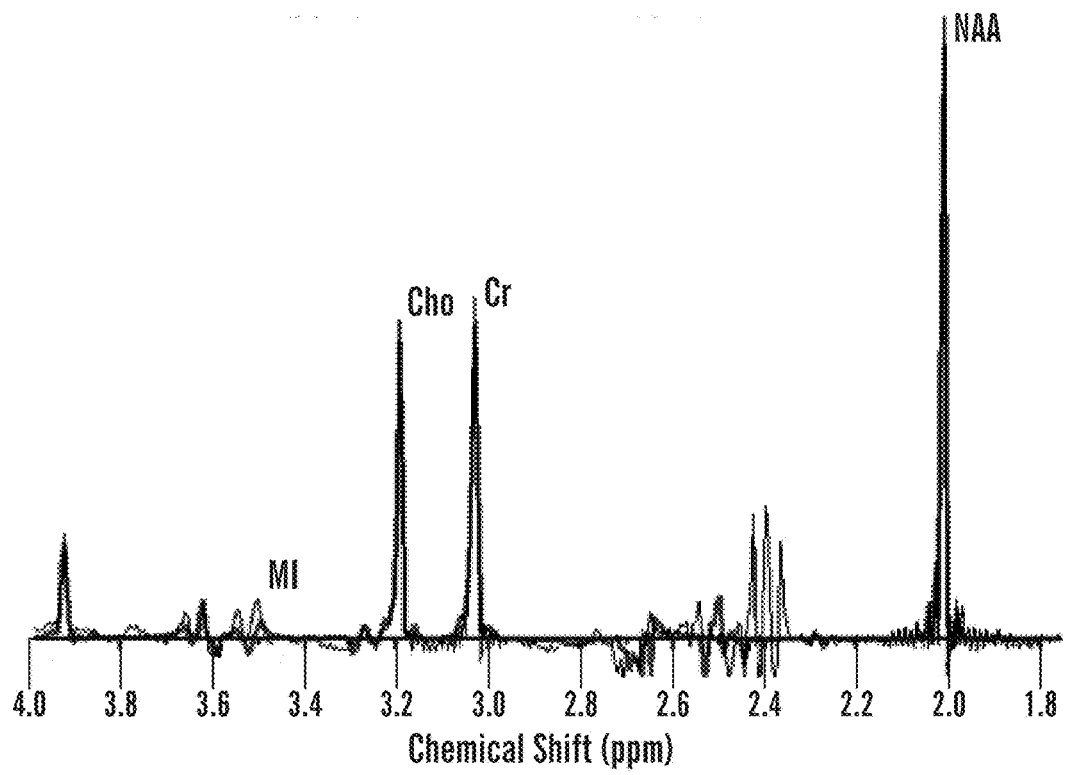
Figure 7H:
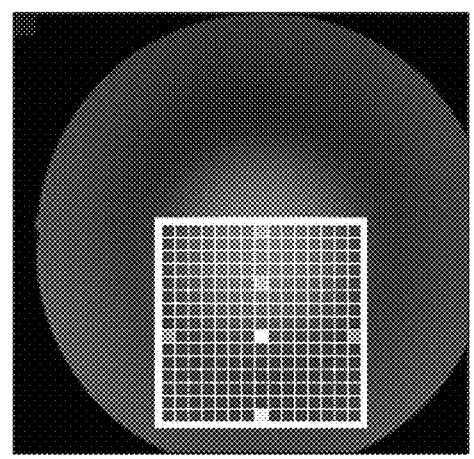
Figures 8A, 8B, 8C, 8D, 8E, 8F:
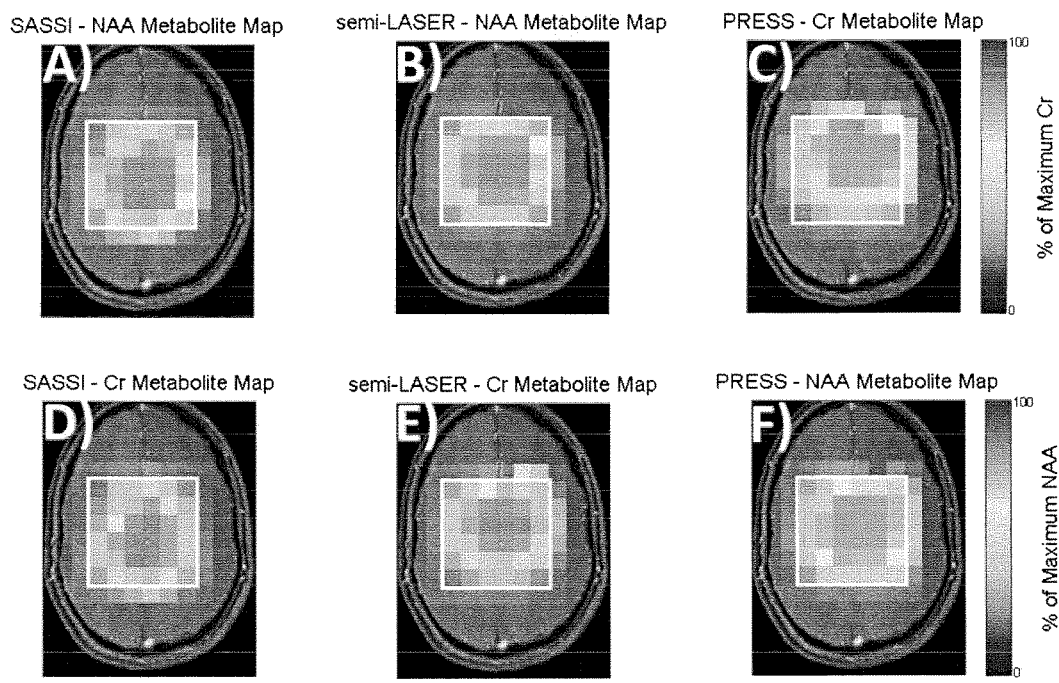
FIGS. 8A-8F illustrate metabolite maps acquired from a human volunteer using SASSI (FIGS. 8A and 8D), semi-LASER (FIGS. 8B and 8E) and PRESS (FIGS. 8C and 8F) for the metabolites NAA and Cr.
Figure 9A:
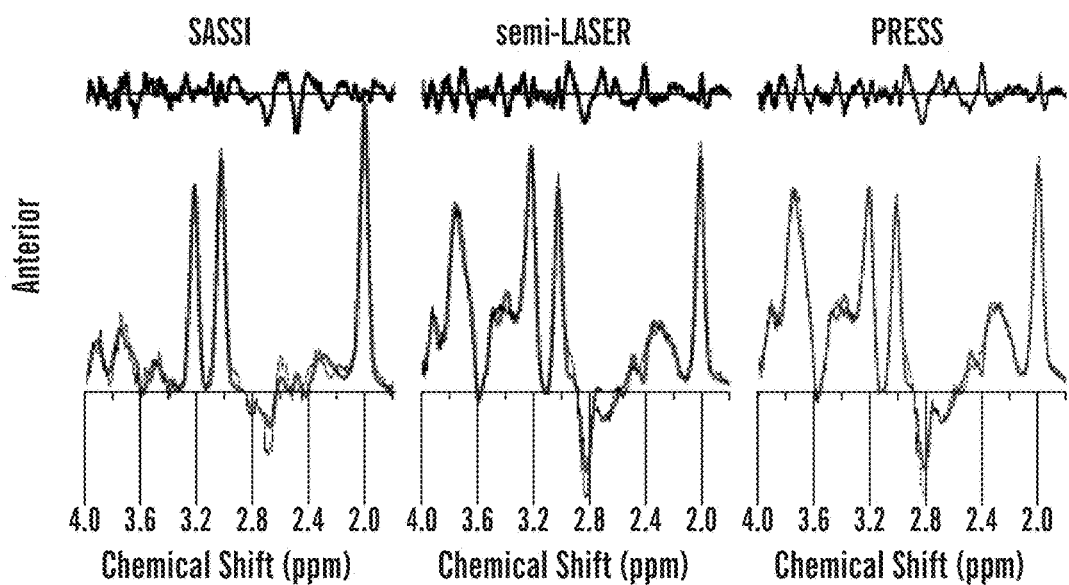
FIGS. 9A-9E illustrate metabolite spectra fit after baseline subtraction and residuals obtained using SASSI, semi-LASER, and PRESS sequences from various regions of the brain of a human volunteer.
Figure 9B:
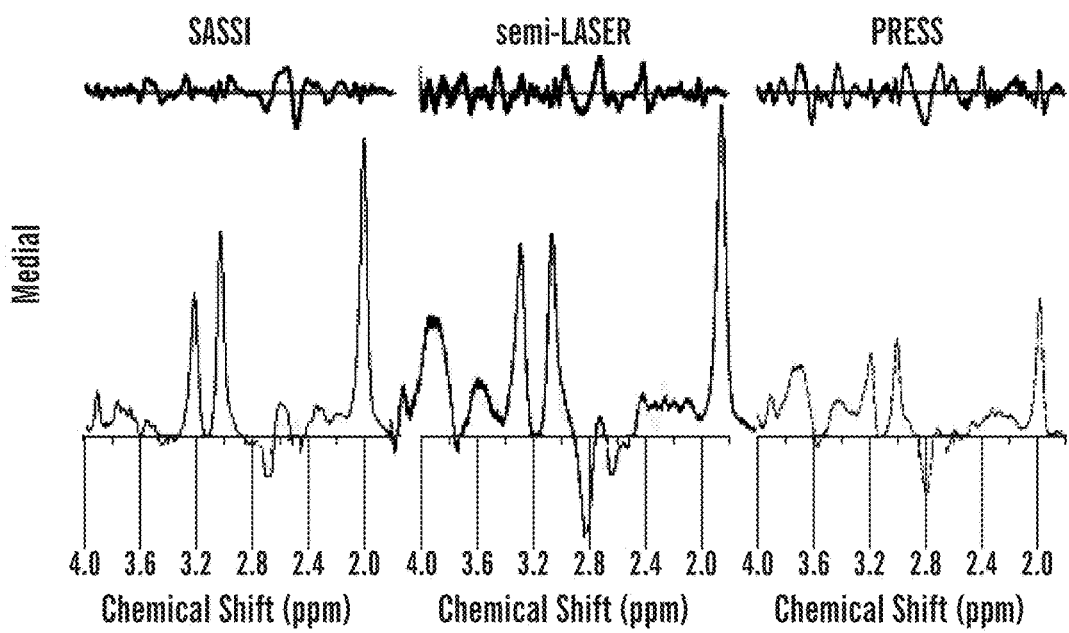
Figure 9C:
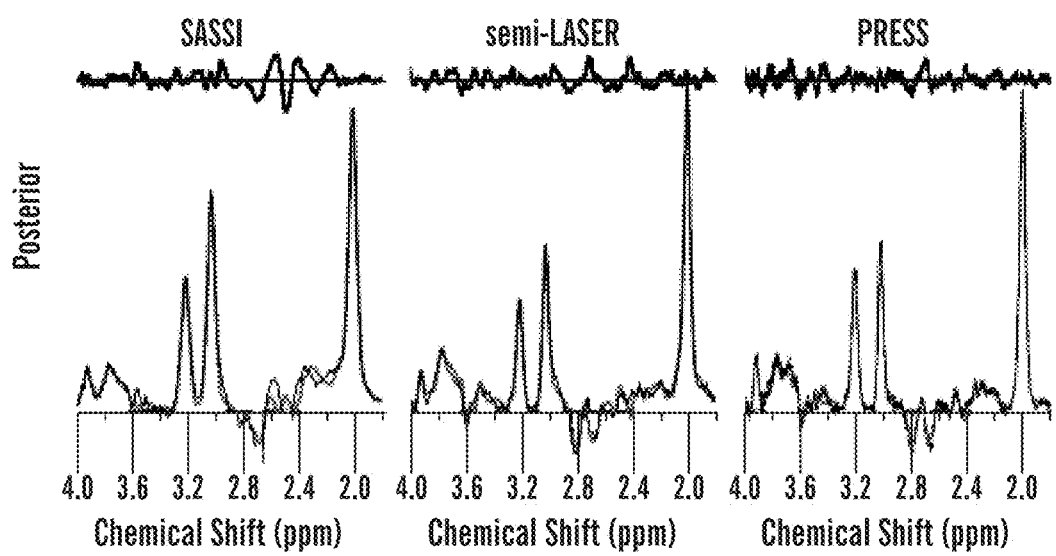
Figure 9D:
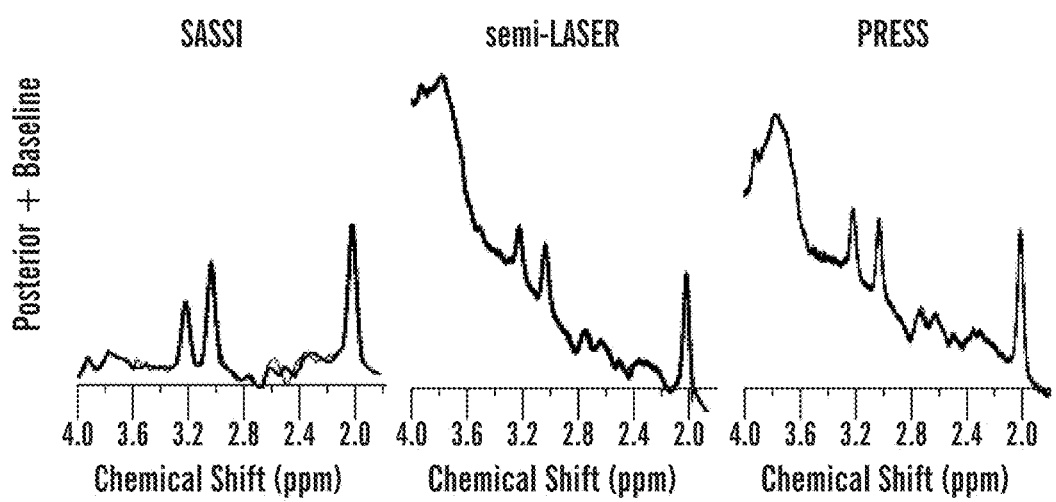
Figure 9E:
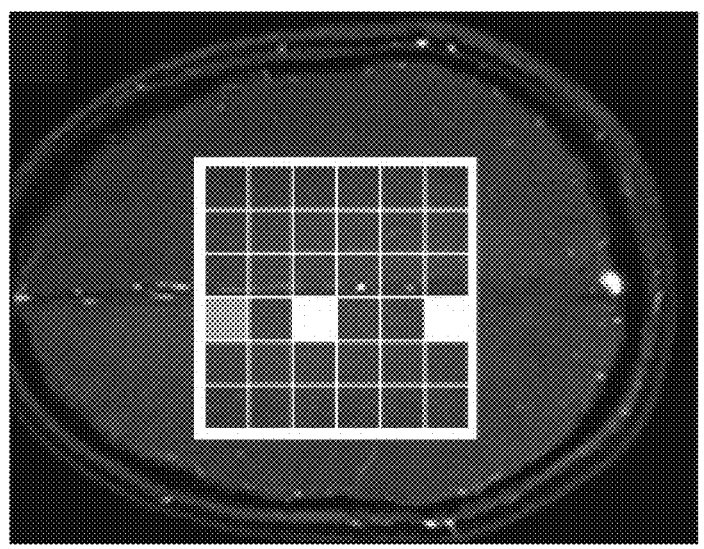

The metabolite maps obtained using the conventional PRESS sequence shown in FIGS. 6C and 6F illustrate the sensitivity of standard spectroscopic imaging to varying $B_1$. The transmit $B_1$ amplitude was calibrated to produce as uniform a flip angle as possible over the volume. Thus in the PRESS sequence, regions of high $B_1$ (shown in FIGS. 5C and 5F) suffer from signal dropout as the refocusing pulses exceed 180 degrees. In regions of lower $B_1$, the refocusing pulses fail to achieve 180 degrees resulting in improper focusing and signal cancellation. As a result, the signal received from the PRESS sequence varies widely over the volume of interest. Both the semi-LASER and the SASSI sequence also show some variation in the signal intensity. This is due to a combination of the non-adiabatic excitation, and some ripple in the spatial profile of the pulses. The use of adiabatic 180 degree pulses results in much more uniform signal selection and greater signal to noise ratio over the volume of interest. Large flip angle pulses, such as 180 degree pulses are much more sensitive to $B_1$ than lower flip angle excitation pulses, making the refocusing pulse's replacement with adiabatic alternatives more critical. Signal inhomogeneity in both the semi-LASER and SASSI pulses is partially due to the non-adiabacity of the excitation pulse used and inhomogeneity in the received sensitivity profile.

FIGS. 6A-6F demonstrate differing behavior for the three sequences in terms of chemical shift localization error. In PRESS, there is a multi-pixel shift in the selected volume for both in-plane dimensions, A-P~=37.5% of the excitation volume, R-L~=18.75% of the excitation volume, between NAA and Cr metabolite peaks separated by 1.0 ppm. For semi-LASER, these numbers were approximately 18.75% of the selected volume in the A-P dimension and 12.5% in the R-L dimension. The difference in A-P and R-L shift in PRESS and semi-LASER is primarily due to the fact that the 90 degree pulse is used to select along one dimension and a 180 degree pulse is used to select along the other dimension. SASSI uses the same 180 degree pulse to select along both in-plane dimensions. The improved performance for semi-LASER and SASSI when compared to PRESS is due to the fact that the adiabatic pulses used in semi-LASER and the spatial sub-pulses used in SASSI have higher bandwidths than the conventional refocusing pulses used in PRESS. As shown in the expanded spectra in FIG. 7G, metabolites from MI to NAA are effectively captured by the spectral passband of the SASSI pulse.

Given the bandwidth of the pulses used in PRESS, the selected volume of interest for MI and NAA would be shifted by approximately 57% in the dimension selected by the 180 degree pulse in conventional PRESS. Semi-LASER would reduce this to 28% and SASSI achieves the best chemical shift localization behavior at less than 5%. To ensure that the metabolites of interest are fully excited within the PRESS box, it is possible to increase the selected volume of interest to larger than the desired volume of interest and use outer volume suppression to suppress the extended regions. However, this approach is vulnerable to lipid contamination which can make imaging regions proscribed near the edge of the brain difficult to realize, particularly when the chemical shift localization error is severe. On average, a 50% reduction in chemical shift localization error is achieved when using semi-LASER instead of conventional PRESS and a greater than 90% reduction of chemical shift localization error when using SASSI instead of conventional PRESS.

Without outer volume suppression, semi-LASER achieves sharper spatial transition bands than SASSI as is evidenced by the sharper edges of the metabolite images in FIGS. 6B and 6E compared with the SASSI metabolite maps in FIGS. 6A and 6D. This is because the time-bandwidth product, and equivalently the selectivity of the short spatial sub-pulses used in SASSI, is limited by the gradient hardware limits and peripheral nerve stimulation limits. The use of outer volume suppression, which is readily available in MRSI, would result in sharpening of the volume of interest edges.

The application of the SASSI, semi-LASER and PRESS spectroscopy sequences in vivo are shown in the metabolite maps in FIGS. 8A-8F and the spectra shown in FIGS. 9A-9E. Table 1, set forth above, shows the signal to noise ratio for each voxel of the spectra illustrated in FIGS. 7A-7H and FIGS. 9A-9E as well as the NAA/Cr ratio. Chemical shift localization error results a reduction of NAA in the anterior voxel and a reduction of Cr in the posterior voxel. Because of the large chemical shift localization error in PRESS acquisitions the ratio ranges from 0-1.705, while the reduced chemical shift localization error in semi-LASER results in as smaller, but still significant variation from 0.3 to 1.601 over the range from the anterior to the posterior voxel in the volume of interest. The SASSI metabolite ratio is consistent over the volume of interest from the most anterior to the most posterior voxel and the NAA/Cr ratio in the phantom varies little, from 1.225 in the anterior phantom voxel to 1.173 in the posterior phantom voxel. A similar pattern is found in in vivo, however with the larger voxel volume, the signal is not completely shifted out the anterior and posterior voxels, resulting in a smaller variation over the range of the in vivo acquisition.

Adiabatic pulses usually operate at higher bandwidths and amplitude (when overdriven above adiabatic threshold) than conventional 180 degree pulses. Therefore, semi-LASER and SASSI deposit more radiofrequency power than conventional PRESS, with semi-LASER being the most specific absorption rate-intensive. Due to specific absorption rate safety constraints on the scanner, the TR of the semi-LASER sequence could not be reduced below 2050 ms in the phantom experiments and 4080 ms in vivo. To provide a fair comparison of specific absorption rate, the TR's of SASSI and PRESS were extended to match semi-LASER, although they could have been considerably shorter. Conventional PRESS deposited the least amount of power, 17% of the system specific absorption rate limit with a TR of 2050 ms in phantom and TR of 4080 ms in vivo. The SASSI pulse deposited 34% of the specific absorption rate in both the phantom and in vivo experiment. Since the SASSI pulses are adiabatic, they still deposit more power than the non-adiabatic pulses used in PRESS sequence. However, the ⅓ reduction in power deposition for SASSI when compared to semi-LASER is due to a reduction to half the number of adiabatic refocusing pulses required and inherent water suppression achieved by the spectrally selective SPSP pulses, eliminating the need for additional water suppression through CHEmical Shift Selective (CHESS) pulses.

As shown in FIGS. 9A-9E, the partial water suppression of the SASSI SPSP pulses performed better than the CHESS water suppression applied using either the PRESS or the semi-LASER pulses. In these spectra, the baselines have not been subtracted, and while the SASSI baseline is relatively flat both in phantom and in vivo, due to the inherent water suppression of the sequence, the in vivo spectra of the PRESS and semi-LASER are greatly affected by the in vivo environment and, as a result, the water suppression is significantly less effective. Post-processing baseline subtraction still permits the fitting of a basis set, and integration under the curves, resulting in the values listed in Table 1. However, the resulting fit produces a noisier, less quantitative measurement.

Other adiabatic SPSP approaches have been proposed for 7 T MRSI such as the previously mentioned interleaved narrowband adiabatic SPSP sequence. SASSI greatly improves upon this approach by utilizing adiabatic SLR spectral envelopes for the adiabatic SPSP pulses in order to cover the entire spectral range from MI to NAA at 7 T without the necessity for spectral interleaving. Furthermore, the adiabatic SLR pulse envelopes may be designed to more uniformly distribute radiofrequency energy over the pulse duration than the conventional hyperbolic secant pulses, enabling shorter pulse durations and therefore a shorter minimum TE of 42 ms versus 90 ms. This makes it possible to capture shorter $T_2$, coupled metabolites such as MI.

Figures 10A, 10B, 10C:
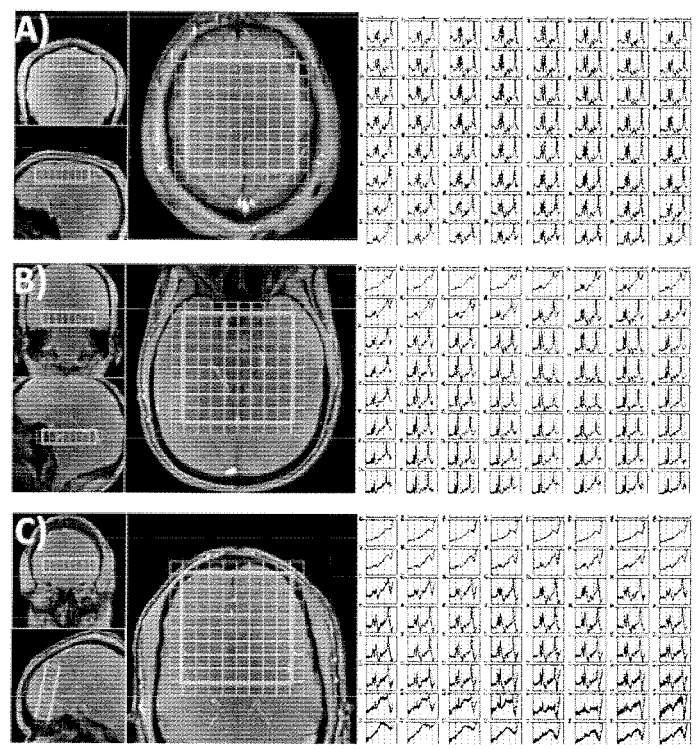
FIGS. 10A-10C illustrate spectra obtained from within the PRESS box using a higher-resolution SASSI spectral grid including the axial spectral grid (FIG. 10A), the oblique spectral grid covering amygdala and hippocampus (FIG. 10B) and the oblique spectral grid covering medial temporal lobe (FIG. 10C).

FIGS. 10A-10C show the spectra results obtained using a TR=1500 ms SASSI sequence in vivo. The reduced power deposition of SASSI when compared with PRESS results in a sequence that is no longer specific absorption rate limited given the T1 relaxation rates of brain metabolites at 7 T. Both an increased number of voxels and an increased number of averages are possible resulting in a higher resolution spectral grid (1 cc vs 1.6 cc) with no loss in signal to noise ratio. This can be seen in the spectra of FIG. 10A as well as the interior voxels of FIGS. 10B and 10C. There is some signal loss in the anterior voxels of both FIGS. 10B and 10C, but this is due to high $B_0$ variation near the sinuses in vivo and at the edges of the cortex, and spectra obtained using both PRESS and semi-LASER suffer in the same manner.

Accordingly, the SASSI sequence addresses several challenges that affect MRSI at 7 T. In particular, SASSI provides greater immunity to the severe $B_1$-inhomogeneity and chemical shift localization errors at 7 T as compared to conventional PRESS. This is achieved through the use of adiabatic SPSP pulses for volume selection. The $B_1$-insensitivity of SASSI is similar to currently available adiabatic alternatives for MRSI, such as semi-LASER, but SASSI deposits a third of the radiofrequency power of the semi-LASER sequence enabling more signal to noise ratio efficient acquisitions and more extensive spatial coverage within reasonable scan times. The spectral-spatial pulses partially suppress the water signal while providing complete excitation of the range of brain metabolites from MI to NAA, substantially reducing the need for additional water suppression, and further reducing the deposited radiofrequency power.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order.

What is claimed is:

1. A method for generating a magnetic resonance image based on a semi-adiabatic spectral-spatial spectroscopic imaging sequence, the method comprising:
   generating, by a magnetic resonance imaging computing device, a pulse control signal comprising a pair of adiabatic pulses and a linear phase pulse;
   transforming, by the magnetic resonance imaging computing device, the pulse control signal into a pair of spectrally and spatially selective refocusing pulses having a spectral bandwidth of at least 500 Hz and an excitation pulse;
   outputting, by the magnetic resonance imaging computing device, the pair of spectrally and spatially selective refocusing pulses and the excitation pulse to a waveform generator to produce the semi-adiabatic spectral-spatial spectroscopic imaging sequence; and
   generating, by the magnetic resonance imaging computing device, a magnetic resonance image based on the pair of spectrally and spatially selective refocusing pulses, the excitation pulse, and alternating lobed gradient pulses.

2. The method as set forth in claim 1, wherein the pair of adiabatic pulses comprise 180 degree adiabatic pulses and the linear phase pulse comprises a 90 degree pulse.

3. The method as set forth in claim 1, wherein the transforming further comprises:
   providing, by the magnetic resonance imaging computing device, a plurality of linear phase spatial sub-pulses;
   sampling, by the magnetic resonance imaging computing device, the pair of adiabatic pulses and the linear phase pulse;
   scaling, by the magnetic resonance imaging computing device, a first group of the plurality of linear phase spatial sub-pulses using the sampled pair of adiabatic pulses to create the pair of spectrally and spatially selective refocusing pulses; and scaling, by the magnetic resonance imaging computing device, a second group of the plurality of linear phase spatial sub-pulses using the linear phase pulse to create the excitation pulse.

4. The method as set forth in claim 3, wherein the pair of adiabatic pulses is sampled in at least twenty-seven evenly spaced locations.

5. The method as set forth in claim 3, wherein the linear phase pulse is sampled in at least eighteen equally spaced locations.

6. The method as set forth in claim 3, wherein the plurality of linear phase spatial sub-pulses comprise a spectral bandwidth of about 8.96 kHz.

7. The method as set forth in claim 1, wherein the pair of spectrally and spatially selective refocusing pulses comprise a spectral bandwidth of about 1.02 kHz, a duration of about 9.8 ms, and a peak radiofrequency amplitude of about 14.36 µT.

8. The method as set forth in claim 1, wherein the excitation pulse comprises a spectral bandwidth of about 1.05 kHz, a duration of about 4.2 ms, and a peak radiofrequency amplitude of about 16.61 µT.

9. The method as set forth in claim 1 further comprising:
generating, by the magnetic resonance imaging computing device, an alternating lobed gradient pulse control signal for each pair of the spectrally and spatially selective refocusing pulses and the excitation pulse; and outputting, by the magnetic resonance imaging computing device, the alternating lobed gradient pulse control signals to a waveform generator to produce the alternating lobed gradient pulses.

10. The method as set forth in claim 9, wherein the alternating lobed gradient pulse control signals are generated to match a sub pulse duration of the spectrally and spatially selective refocusing pulses and the excitation pulse.

11. The method as set forth in claim 1, wherein the generating further comprises:
integrating, by the magnetic resonance imaging computing device, the pair of spectrally and spatially selective refocusing pulses and the excitation pulse in a point resolved spectroscopy sequence; and coupling, by the magnetic resonance imaging computing device, the point resolved spectroscopy sequence with the alternating lobed gradient pulses to generate the magnetic resonance image.

12. The method as set forth in claim 1, wherein the generating further comprises selecting a spectral bandwidth for the pair of adiabatic pulses configured to obtain a magnetic resonance image providing a representation of a concentration of a metabolite.

13. The method as set forth in claim 12, wherein the metabolite comprises at least one of myo-inositol, choline, creatine, or n-acetylaspartate.

14. A magnetic resonance imaging computing device comprising:
at least one processor;
and a memory coupled to the processor which is configured to be capable of executing programmed instructions comprising and stored in the memory to:
generate a pulse control signal comprising a pair of adiabatic pulses and a linear phase pulse;

transform the pulse control signal into a pair of spectrally and spatially selective refocusing pulses having a spectral bandwidth of at least 500 Hz and an excitation pulse;

output the pair of spectrally and spatially selective refocusing pulses and the excitation pulse to a waveform generator to produce the semi-adiabatic spectral-spatial spectroscopic imaging sequence; and generate a magnetic resonance image based on the pair of spectrally and spatially selective refocusing pulses, the excitation pulse, and alternating lobed gradient pulses.

15. The device as set forth in claim 14, wherein the pair of adiabatic pulses comprise 180 degree adiabatic pulses and the linear phase pulse comprises a 90 degree pulse.

16. The device as set forth in claim 14, wherein the processor coupled to the memory is further configured to be capable of executing additional programmed instructions to:
provide a plurality of linear phase spatial sub-pulses;
sample the pair of adiabatic pulses and the linear phase pulse;
scale a first group of the plurality of linear phase spatial sub-pulses using the sampled pair of adiabatic pulses to create the pair of spectrally and spatially selective refocusing pulses; and
scale a second group of the plurality of linear phase spatial sub-pulses using the linear phase pulse to create the excitation pulse.

17. The device as set forth in claim 16, wherein the pair of adiabatic pulses is sampled in at least twenty-seven evenly spaced locations.

18. The device as set forth in claim 16, wherein the linear phase pulse is sampled in at least eighteen equally spaced locations.

19. The device as set forth in claim 16, wherein the plurality of linear phase spatial sub-pulses comprise a spectral bandwidth of about 8.96 kHz.

20. The device as set forth in claim 14, wherein the pair of spectrally and spatially selective refocusing pulses comprise a spectral bandwidth of about 1.02 kHz, a duration of about 9.8 ms, and a peak radiofrequency amplitude of about 14.36 µT.

21. The device as set forth in claim 14, wherein the excitation pulse comprises a spectral bandwidth of about 1.05 kHz, a duration of about 4.2 ms, and a peak radiofrequency amplitude of about 16.61 µT.

22. The device as set forth in claim 14, wherein the processor coupled to the memory is further configured to be capable of executing additional programmed instructions to:
generate an alternating lobed gradient pulse control signal for each of the spectrally and spatially selective refocusing pulses and the excitation pulse; and
output the alternating lobed gradient pulse control signals to the waveform generator to produce the alternating lobed gradient pulses.

23. The device as set forth in claim 22, wherein the alternating lobed gradient pulse control signals are generated to match a sub pulse duration of the spectrally and spatially selective refocusing pulses and the excitation pulse.

24. The device as set forth in claim 14, wherein the processor coupled to the memory is further configured to be capable of executing additional programmed instructions to:
integrate the pair of spectrally and spatially selective refocusing pulses and the excitation pulse in a point resolved spectroscopy sequence; and couple the point resolved spectroscopy sequence with the alternating lobed gradient pulses to generate the magnetic resonance image.

25. The device as set forth in claim 14, wherein the generating further comprises selecting a spectral bandwidth for the pair of adiabatic pulses configured to obtain a magnetic resonance image providing a representation of a concentration of a metabolite.

26. The device as set forth in claim 25, wherein the metabolite comprises at least one of myo-inositol, choline, creatine, or n-acetylaspartate.

27. A non-transitory computer readable medium having stored thereon instructions for producing a pulse pair for magnetic resonance imaging comprising executable code which when executed by a processor, causes the processor to perform steps comprising:
  generating a pulse control signal comprising a pair of adiabatic pulses and a linear phase pulse;
  transforming the pulse control signal into a pair of spectrally and spatially selective refocusing pulses having a spectral bandwidth of at least 500 Hz and an excitation pulse;
  outputting the pair of spectrally and spatially selective refocusing pulses and the excitation pulse to a waveform generator to produce the semi-adiabatic spectroscopic imaging sequence; and
  generating a magnetic resonance image based on the pair of spectrally and spatially selective refocusing pulses, the excitation pulse, and alternating lobed gradient pulses.

28. The medium as set forth in claim 27, wherein the pair of adiabatic pulses comprise 180 degree adiabatic pulses and the linear phase pulse comprises a 90 degree pulse.

29. The medium as set forth in claim 27, wherein transforming further comprises:
  providing a plurality of linear phase spatial sub-pulses;
  sampling the pair of adiabatic pulses and the linear phase pulse;
  scaling a first group of the plurality of linear phase spatial sub-pulses using the sampled pair of adiabatic pulses to create the pair of spectrally and spatially selective refocusing pulses; and
  scaling a second group of the plurality of linear phase spatial sub-pulses using the linear phase pulse to create the excitation pulse.

30. The medium as set forth in claim 29, wherein the pair of adiabatic pulses is sampled in at least twenty-seven evenly spaced locations.

31. The medium as set forth in claim 29, wherein the linear phase pulse is sampled in at least eighteen equally spaced locations.

32. The medium as set forth in claim 29, wherein the plurality of linear phase spatial sub-pulses comprise a spectral bandwidth of about 8.96 kHz.

33. The medium as set forth in claim 27, wherein the pair of spectrally and spatially selective refocusing pulses comprise a spectral bandwidth of about 1.02 kHz, a duration of about 9.8 ms, and a peak radiofrequency amplitude of about 14.36 µT.

34. The medium as set forth in claim 27, wherein the excitation pulse comprises a spectral bandwidth of about 1.05 kHz, a duration of about 4.2 ms, and a peak radiofrequency amplitude of about 16.61 µT.

35. The medium as set forth in claim 27 further having stored thereon at least one additional instruction that when executed by the processor causes the processor to perform additional steps comprising:
  generating an alternating lobed gradient pulse control signal for each of the pair of spectrally and spatially selective refocusing pulses and the excitation pulse; and
  outputting the alternating lobed gradient pulse control signals to the waveform generator to produce the alternating lobed gradient pulses.

36. The medium as set forth in claim 35, wherein the alternating lobed gradient pulse control signals are generated to match a sub pulse duration of the pair of spectrally and spatially selective refocusing pulses and the excitation pulse.

37. The medium as set forth in claim 27, wherein the generating further comprises:
  integrating the pair of spectrally and spatially selective refocusing pulses and the excitation pulse in a point resolved spectroscopy sequence; and
  coupling the point resolved spectroscopy sequence with the alternating lobed gradient pulses to generate the magnetic resonance image.

38. The medium as set forth in claim 27, wherein the generating further comprises selecting a spectral bandwidth for the pair of adiabatic pulses configured to obtain a magnetic resonance image providing a representation of a concentration of a metabolite.

39. The medium as set forth in claim 38, wherein the metabolite comprises at least one of myo-inositol, choline, creatine, or n-acetylaspartate.

* * * * *